United States Patent
Jung et al.

(10) Patent No.: US 7,129,719 B2
(45) Date of Patent: Oct. 31, 2006

(54) APPARATUS FOR DETECTING DEFECT IN CIRCUIT PATTERN AND DEFECT DETECTING SYSTEM HAVING THE SAME

(75) Inventors: Boo-Yang Jung, Yongin-si (KR); Seong-Young Han, Yongin-si (KR); Bruce Kim, Tempe, AZ (US)

(73) Assignee: Samsung Techwin Co., Ltd. (KR)

( * ) Notice: Subject to any disclaimer, the term of this patent is extended or adjusted under 35 U.S.C. 154(b) by 11 days.

(21) Appl. No.: 10/858,166

(22) Filed: Jun. 1, 2004

(65) Prior Publication Data

US 2005/0264306 A1    Dec. 1, 2005

(51) Int. Cl.
*G01R 27/08* (2006.01)
*G01R 27/32* (2006.01)

(52) U.S. Cl. ...................... 324/718; 324/646

(58) Field of Classification Search ........... 324/717, 324/715, 713, 691, 649, 600, 501, 534, 537, 324/718, 633, 638, 646, 652, 637; 714/736, 714/738, 25
See application file for complete search history.

(56) References Cited

U.S. PATENT DOCUMENTS

| | | | | |
|---|---|---|---|---|
| 4,179,652 A | * | 12/1979 | Davis | 324/715 |
| 4,646,299 A | * | 2/1987 | Schinabeck et al. | 714/736 |
| 4,851,794 A | * | 7/1989 | Williams et al. | 333/33 |
| 5,337,261 A | * | 8/1994 | Rogers | 702/190 |
| 5,798,649 A | * | 8/1998 | Smayling et al. | 324/551 |
| 6,051,828 A | * | 4/2000 | Patterson | 250/214 R |
| 6,089,095 A | * | 7/2000 | Yang et al. | 73/600 |
| 6,111,414 A | | 8/2000 | Chatterjee | |
| 6,125,703 A | * | 10/2000 | Mac Lauchlan et al. | 73/592 |
| 6,513,137 B1 | * | 1/2003 | Cortner et al. | 714/736 |
| 6,937,035 B1 | * | 8/2005 | Kawaike et al. | 324/750 |
| 2005/0129104 A1 | * | 6/2005 | Ishida et al. | 375/224 |

* cited by examiner

Primary Examiner—Vincent Q. Nguyen
Assistant Examiner—Hoai-An D. Nguyen
(74) Attorney, Agent, or Firm—Johnston & Reens LLC

(57) ABSTRACT

Provided is an apparatus for detecting a defect of a circuit pattern which includes a resonator, a first power supply unit connected to one end of the resonator to apply power to the resonator, a probe connected to the other end of the resonator to contact one end of the circuit pattern, a second power supply unit connected to the other end of the circuit pattern to apply a voltage thereto, and a detection portion connected between the resonator and the probe to measure a voltage generated from the circuit pattern and generate a measurement voltage, and determine presence of a defect in the circuit pattern from the measurement voltage.

19 Claims, 10 Drawing Sheets

FIG. 1 (PRIOR ART)

| Detail | Capacitance | Resistance | Capacitance & Resistance | E-beam | Latent | TDVA | Resonator |
|---|---|---|---|---|---|---|---|
| Frequency | 1-10MHz | DC | 1-10MHz, DC | - | 1KHz-1MHz | 30-70GHz | 700Mhz - 2GHz |
| Probe head | 1 | 2 | 2 | None | 2 | 1 or 2 | 1 |
| Probe movement | Simple | Complex | Simple | Complex | Complex | Complex | Simple |
| Test time | Medium | Long | Medium | Short | Long | Long | Short |
| Open resolution | Fair | Good | Good | Very good | Excellent | Good | Excellent |
| Short resolution | Good | Good | Good | Good | - | Good | Excellent |

FIG. 2 (PRIOR ART)

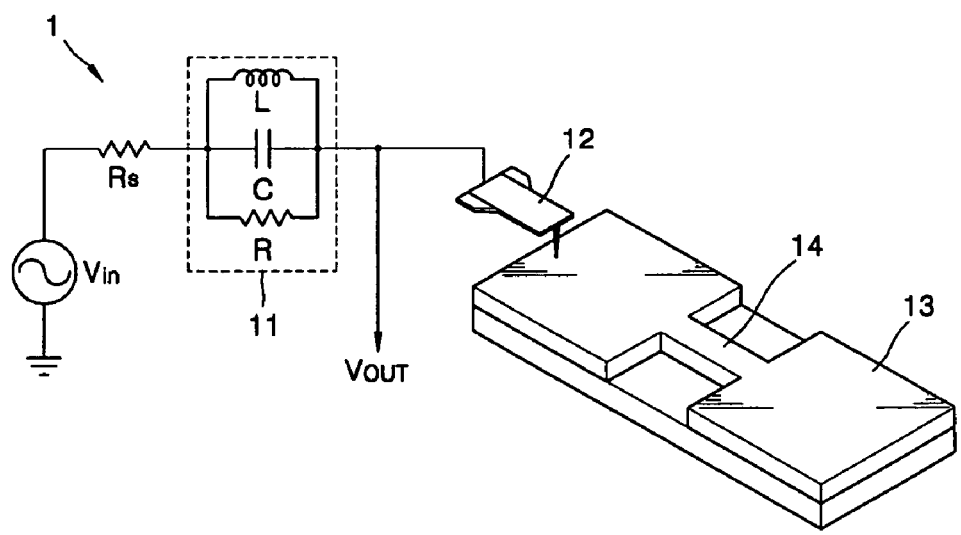

APPARATUS FOR DETECTING DEFECT IN CIRCUIT PATTERN AND DEFECT DETECTING SYSTEM HAVING THE SAME

BACKGROUND OF THE INVENTION

1. Field of the Invention

The present invention relates to an apparatus for detecting a defect of a circuit pattern of a semiconductor substrate or a semiconductor package which has a fine circuit pattern, and a defect detecting system having the same, and more particularly, to an apparatus for detecting a defect of a circuit pattern which detects presence of a defect in the connection of the circuit pattern of a semiconductor package by measuring a return loss of the circuit pattern according to an input signal output from a resonator, and a defect detecting system having the same.

2. Description of the Related Art

A semiconductor package is formed by mounting a semiconductor device on a substrate where a circuit pattern is formed. The semiconductor package needs to protect the semiconductor device from external surroundings and enable stable transmission of electric signals to the outside. In the semiconductor package, to stably transmit the electric signals, there must be no defect in the circuit pattern formed on the substrate. If a defect exists in the circuit pattern, reliability of a product is lowered in actual use thereof.

Thus, detecting a defect in the circuit pattern connection of a semiconductor package is one of very important works. During a semiconductor packaging process, the detection of a defect in electric connection is carried out in a final test step before mass production of the substrate and the final step of a packaging process in which a semiconductor device is mounted on the substrate. A visual inspection method, a capacitance measurement method, and a resistance measurement method are widely used for the detection of a defect.

However, with an increase of the number of input/output ports of a semiconductor device, a pitch of the circuit pattern formed on the substrate decreases so that the width of a circuit pattern decreases and the size of a defect generated in the circuit pattern decreases as well. Thus, when a circuit pattern having a fine pitch is inspected, since a difference between a voltage detected from a circuit pattern where a defect is not present and a voltage a circuit pattern having a defect is very small, it is difficult to detect the defect in spite of the presence of a defect. Although a variety of methods to detect a defect in a fine circuit pattern are used as shown in FIG. 1, these methods have the followings problems.

First, in a capacitance measurement method, electric conductivity is measured by one-to-one matching a probe and an electrode of a circuit pattern. This method can be simply used, but measurement of discontinuity is difficult.

Second, a resistance measurement method has a demerit in that a detection time increases when a circuit is shorted.

Third, in a measurement method using an E-beam, a circuit pattern is charged with an electron beam and a defect is detected according to whether a leakage occurs. However, this method is disadvantageous because a cost of an equipment for the method is high.

As a method to solve the above problems, U.S. Pat. No. 6,111,414. discloses a detection method using a resonator. In the method, since a single probe is used, the principle of measurement is simple, measurement time and resolution are superior to other conventional methods and reliability thereof is high.

FIG. 2 shows a circuit pattern defect detecting apparatus 1 using a resonator disclosed in U.S. Pat. No. 6,111,414. A radio frequency (RF) resonator 11 is connected between a probe 12 and an RF power supply portion Vin. The probe 12 contacts one end portion of a circuit pattern 13. An interconnect 14 connecting ports is formed on the circuit pattern 13.

In a defect detection method using the circuit pattern defect detection apparatus 1, a resonator having a relatively high quality factor is used to measure an electrical connection state of multi-chip modules. The presence of a defect is detected by comparing magnitude of an output voltage $V_{OUT}$ signal obtained by making the probe 12 contact the circuit pattern 13 having no defect and applying a voltage thereto, and an output voltage $V_{OUT}$ signal obtained by making the probe 12 contact the circuit pattern 13 having a defect and applying a voltage thereto.

In the circuit pattern defect detection apparatus 1 using the RF resonator 11, a signal at a particular frequency is amplified using the resonator after the signal is output from an RE source (not shown). The frequency and magnitude of the output voltage $V_{OUT}$ varies according to additional loading generated as the circuit pattern is connected to the resonant circuit.

FIG. 3 is a view showing the shapes and types of circuit pattern defects which can be generated during manufacture of a substrate. FIG. 4 is a graph showing a frequency response according to the types of the circuit pattern defects of FIG. 3. In FIG. 3, (a) through (e) correspond to cases of a defect-free state, an open defect, a mouse bite defect, a near-short defect, and a short defect, respectively.

As shown in FIG. 4, the resonant frequency and the magnitude in a state of not being connected to the circuit pattern are $\omega_{PROBE}$ and Mp, respectively. When the probe is connected to the circuit pattern, the resonant frequency and the magnitude of the output voltage $V_{OUT}$ are moved to $\omega_{REF}$ and Mp in the graph, respectively, by additional loading of the circuit pattern.

The resonant frequency and the magnitude of the output voltage $V_{OUT}$ have changed characteristic values according to the state of the circuit pattern such as the defect-free state, the open defect, and the short defect. For the open defect, the peak moves from $\omega_{REF}$ to $\omega_{OPEN}$ and the magnitude thereof is slightly decreased. For the short defect, the resonant frequency $\omega_{SHORT}$ moves to the left on the graph and the amount of decrease of the magnitude $M_S$ is greater than that of the open defect.

Accordingly, the resonant frequency and the magnitude change according to the type of a circuit pattern. Thus, if the resonant frequency and the magnitude in a defect-free state are known, a resonant frequency and a magnitude of a certain circuit pattern are measured and compared with those in the defect-free state so that the presence and type of a defect can be detected.

In the above measurement method, in case of a fine circuit, the presence of a defect is well detected at a position of a near end of the circuit pattern where the probe contacts. However, the presence of a defect at a position of a far end of the circuit pattern separated away from the near end where the probe contacts, is difficult to be detected. Also, even if a defect is detected, since a difference in the frequency and magnitude of the detected output voltage $V_{OUT}$ when a defect exists and the detected output voltage $V_{OUT}$ when a defect does not exist is not great, an error in measurement may be generated.

FIGS. 5 and 6 are graphs showing a differential voltage characteristic of a frequency between a defect-free case and cases in which a 30% mouse bite exists at a near end and a far end.

As shown in FIG. 5, when a 30% mouse bite exists at a near end, a resonant frequency is about 830 MHz and a differential voltage is about 190 mV. Also, as shown in FIG. 6, when a 30% mouse bite exists at a far end, a resonant frequency is about 850 MHz and a differential voltage is about 12 mV, which is smaller than that of FIG. 5 so that a larger differential voltage is required to accurately detect a defect. Also, since it is difficult to detect a defect generated in the far end of the circuit pattern, reliability of the circuit pattern cannot be guaranteed.

SUMMARY OF THE INVENTION

To solve the above and/or other problems, the present invention provides an apparatus for detecting a defect of a circuit pattern which can easily detect a defect of a substrate having a fine circuit pattern and inspect a defect in the interconnection of a circuit pattern based on a defectiveness classified by the type and position of the defect, and a defect detection system having the same.

According to one aspect of the present invention, an apparatus to test an electronic device comprises a circuit to apply an electrical parameter to a first section of the electronic device, an element coupled to a second section of the electronic device to change a value of the applied electrical parameter, and a detection portion in communication with the circuit to measure the changed value of the applied electrical parameter and to compare the measured changed value of the applied electrical parameter to a benchmark to determine a status of the electronic device.

According to one aspect of the present invention, an apparatus for detecting a defect of a circuit pattern comprises a resonator, a first power supply unit connected to one end of the resonator to apply power to the resonator, a probe connected to the other end of the resonator to contact one end of the circuit pattern, a second power supply unit connected to the other end of the circuit pattern to apply a voltage thereto, and a detection portion connected between the resonator and the probe to measure a voltage generated from the circuit pattern and generate a measurement voltage, and determine presence of a defect in the circuit pattern from the measurement voltage.

The detection portion comprises a measurement portion connected between the resonator and the probe to measure the measurement voltage, and a determination portion to determine presence of a defect of the circuit pattern from the measurement voltage.

As the type of a defect, there are an open defect, a mouse bite, a pseudo short, and a short, and the type of a defect is determined according to the pattern of the measurement voltage.

According to another aspect of the present invention, an apparatus for detecting a defect of a circuit pattern comprises a resonator, a first power supply unit connected to one end of the resonator to apply power to the resonator, a probe connected to the other end of the resonator to contact one end of the circuit pattern, a second power supply unit connected to the other end of the circuit pattern to apply a voltage thereto, and a detection portion connected between the resonator and the probe to measure an input end reflection coefficient that is a ratio of a reflection wave power with respect to an incident wave power of the circuit pattern and determine presence and type of a defect in the circuit pattern from the input end reflection coefficient.

The detection portion comprises an input end reflection coefficient measurement portion which is connected between the resonator and the probe to measure the input end reflection coefficient, and a determination portion which determines present and type of a defect of the circuit pattern from the input end reflection coefficient.

According to another aspect of the present invention, an apparatus for detecting a defect of a circuit pattern comprises a resonator, a first power supply unit connected to one end of the resonator to apply power to the resonator, a probe connected to the other end of the resonator to contact one end of the circuit pattern, an amplification portion connected between the resonator and the probe to generate an amplification voltage by amplifying a signal modulated by an additional loading of the circuit pattern, and a detection portion connected the amplification portion to measure the amplification voltage and generate a measurement voltage, and determine presence and type of a defect in the circuit pattern from the measurement voltage.

According to another aspect of the present invention, an apparatus for detecting a defect of a plurality of circuit patterns comprises a resonator, a first power supply unit connected to one end of the resonator to apply power to the resonator, a probe having a plurality of probe portions which are connected to the other end of the resonator and contact one end of each of the circuit patterns, one or more first switches connected between the resonator and the probe to switch connection between the resonator and each of the probe portions of the probe, a second power supply unit connected to the other end of each of the circuit patterns to apply power thereto, one or more second switches connected between the other end of each of the circuit patterns and the second power supply unit to switch connection between each circuit pattern and the second power supply unit, a detection portion connected between the resonator and each of the first switches to measure a voltage generated from one of the circuit patterns and generate a measurement voltage, and determine presence and type of a defect in the circuit patterns from the measurement voltage, and a switching control portion receiving a switch control signal from the detection portion and controlling switching of the first and second switches.

The detection portion comprises a filter which filters an AC analog signal modulated by the circuit patterns and generates a filtering signal, a rectifier which receives the filtering signal and generates a DC analog signal, an analog-to-digital converter which generates a digital measurement signal from the DC analog signal, a memory which stores a reference signal that is measurement signal data, according to a type of a defect of the circuit pattern, and a determination portion which determines presence and type of a defect of the circuit patterns by comparing the measurement signal with the reference signal.

The determination portion generates a digital switching control signal according to completion of determination of presence and type of a defect of the circuit patterns, and the switching control portion comprises a digital-to-analog converter which generates an analog switching control signal from the digital switching control signal, and a demultiplexer which controls switching of the first and second switches by the analog switching control signal.

BRIEF DESCRIPTION OF DRAWINGS

The above and other features and advantages of the present invention will become more apparent by describing in detail preferred embodiments thereof with reference to the attached drawings in which:

FIG. 1 is a table showing the details of conventional circuit pattern defect detecting apparatuses;

FIG. 2 is a view illustrating a conventional circuit pattern defect detecting apparatus using a resonator;

DETAILED DESCRIPTION OF EMBODIMENTS

Figure 7:
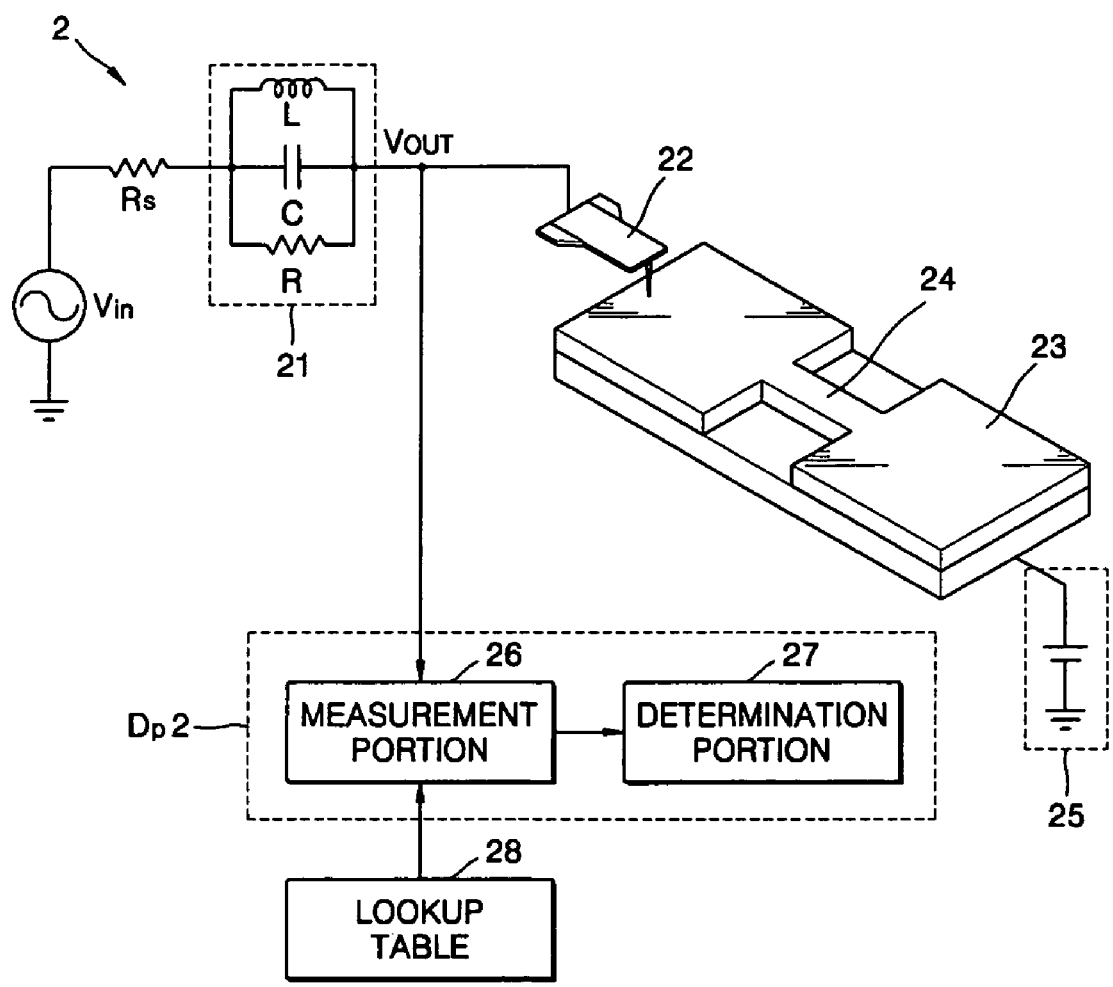
FIG. 7 is a circuit diagram showing an apparatus for detecting a defect of a circuit pattern according to an embodiment of the present invention.
Figure 8:
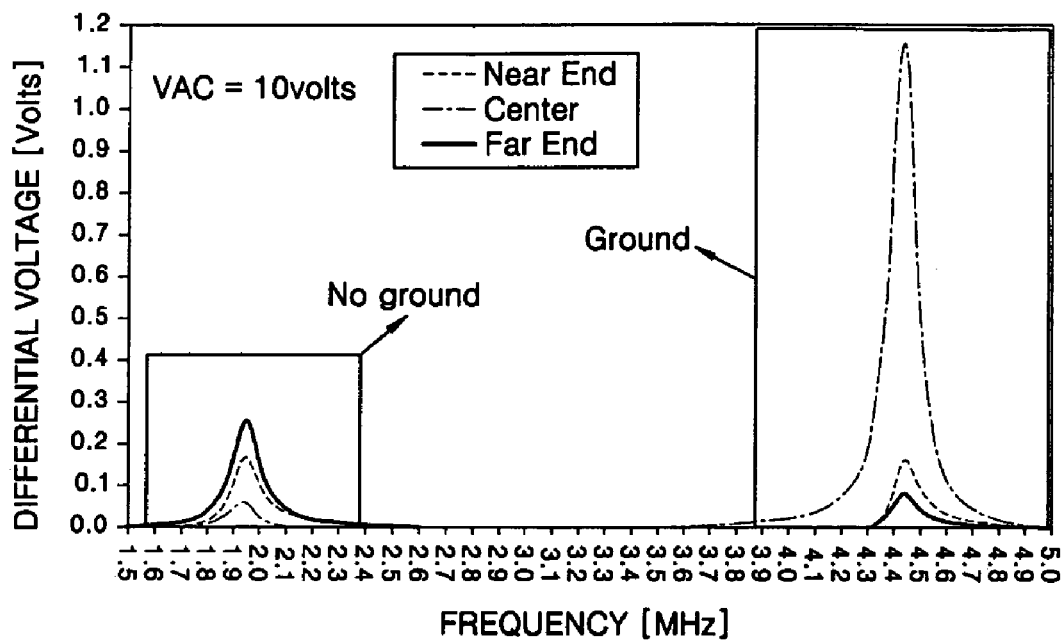
FIG. 8 is a graph showing the result of comparison between cases in which a second power supply unit is present and a second power supply unit is not present, when a defect of a circuit pattern detected by the circuit pattern defect detecting apparatus of FIG. 7 is a mouse bite.
Figure 9:
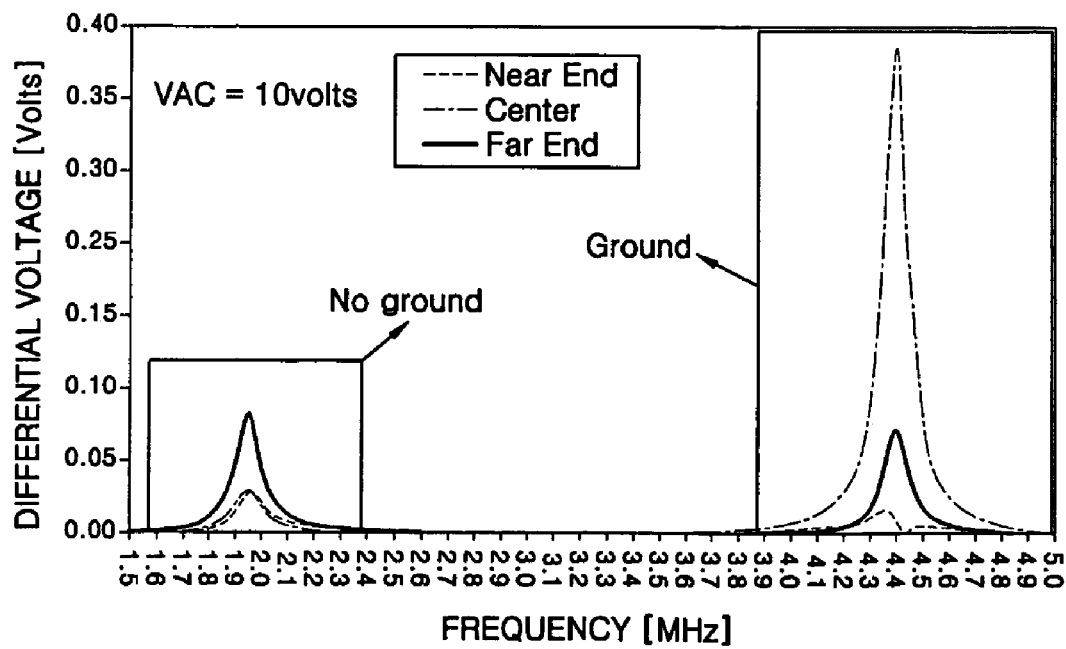
FIG. 9 is a graph showing the result of comparison between cases in which a second power supply unit is present and a second power supply unit is not present, when a defect of a circuit pattern detected by the circuit pattern defect detecting apparatus of FIG. 7 is a near short.
Figure 10:
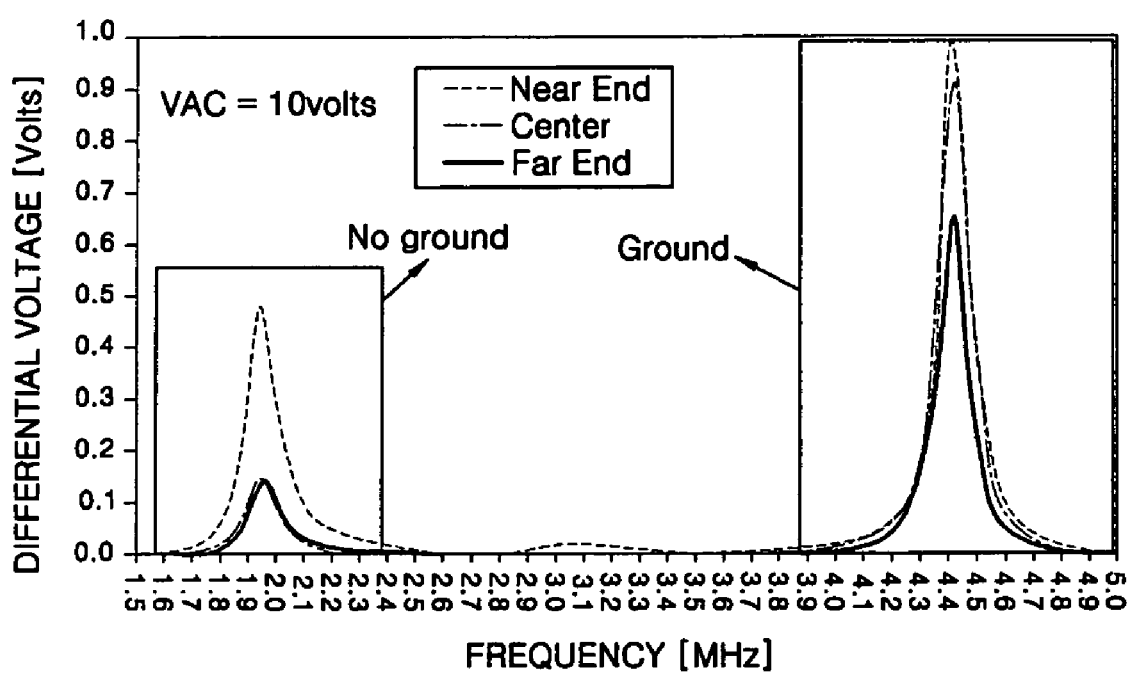
FIG. 10 is a graph showing the result of comparison between cases in which a second power supply unit is present and a second power supply unit is not present, when a defect of a circuit pattern detected by the circuit pattern defect detecting apparatus of FIG. 7 is an open defect.

FIG. 7 shows the configuration of a circuit of an apparatus for detecting a defect of a circuit pattern according to an embodiment of the present invention. FIGS. 8 through 10 are graphs showing the results of comparisons between cases in which a second power supply unit is present and a second power supply unit is not present, when a defect of a circuit pattern detected by the circuit pattern defect detecting apparatus of FIG. 7 is a mouse bite, a near short, and an open defect.

Referring to the drawings, an apparatus 2 for detecting a defect of an electronic device such as circuit pattern 23 of a circuit board comprises a circuit including a resonator 21, a first power supply unit $V_{in}$, and a probe 22, and an element such as a second power supply unit 25, and a detection portion Dp2.

The resonator 21 generates a resonant signal and amplifies a signal responded from the circuit pattern 23. The first power supply unit $V_{in}$ is connected to one end of the resonator 21 and supplies power to the resonator 21. The probe 22 is connected to the other end of the resonator 21 to contact one end of the circuit pattern 23. The second power supply unit 25 is connected to the other end of the circuit pattern 23 and applies a voltage to the circuit pattern 23. The detection portion Dp2 is connected between the resonator 21 and the probe 22, measures a voltage generated by the circuit pattern 23 and generates a measurement voltage, and detects the presence of a defect in the circuit pattern 23 based on the measurement voltage. In an alternative embodiment, the power supplies can be a current source.

In the circuit pattern defect detecting apparatus 2 according to the present invention, to accurately detect a defect and distinguish the type of the defect so as to prevent generation of an error in measurement, a differential voltage between a voltage value obtained by measuring the defect and a voltage value measured when there is no defect, e.g. benchmark, is made greater. In the present embodiment, to increase the differential voltage, a voltage source or ground is connected as the second power supply unit 25 to a far end of the circuit pattern 23 at the opposite side from the probe 22 so that a voltage drop according to a change in impedance formed by the circuit pattern 23 can be remarkably generated by the defect.

That is, since ground is formed at the far end of the circuit pattern 23 separated far from the probe 22 as the second power supply unit 25, a current value changes greatly according to a small change in impedance. Thus, a change value of a frequency and magnitude of a measurement voltage $V_{OUT}$ according to a characteristic of a defect of the circuit pattern 23 can be well recognized.

Figure 3:
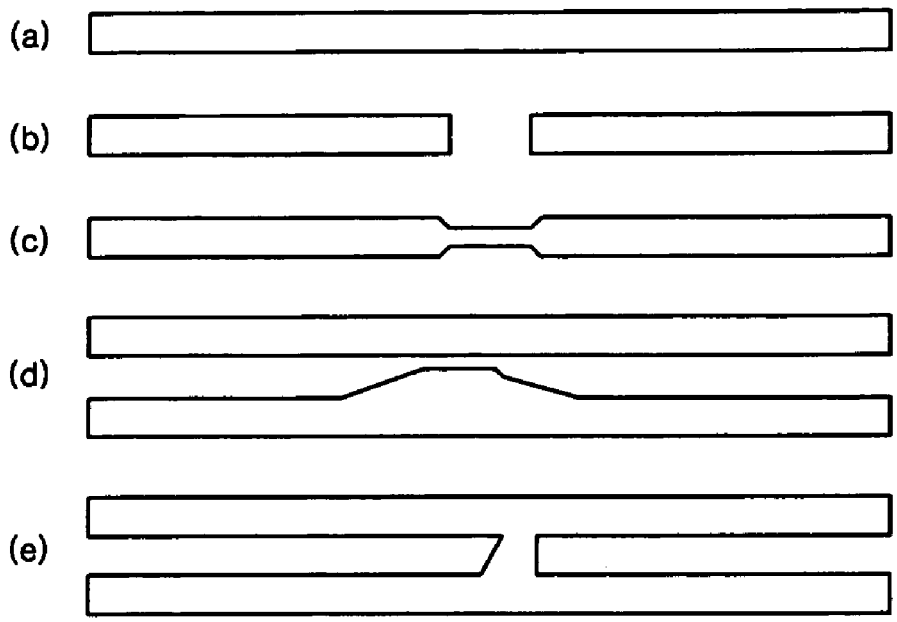
FIG. 3 is a view illustrating the shape and type of a defect of a circuit pattern which can be generated during manufacturing of a substrate.
Figure 4:
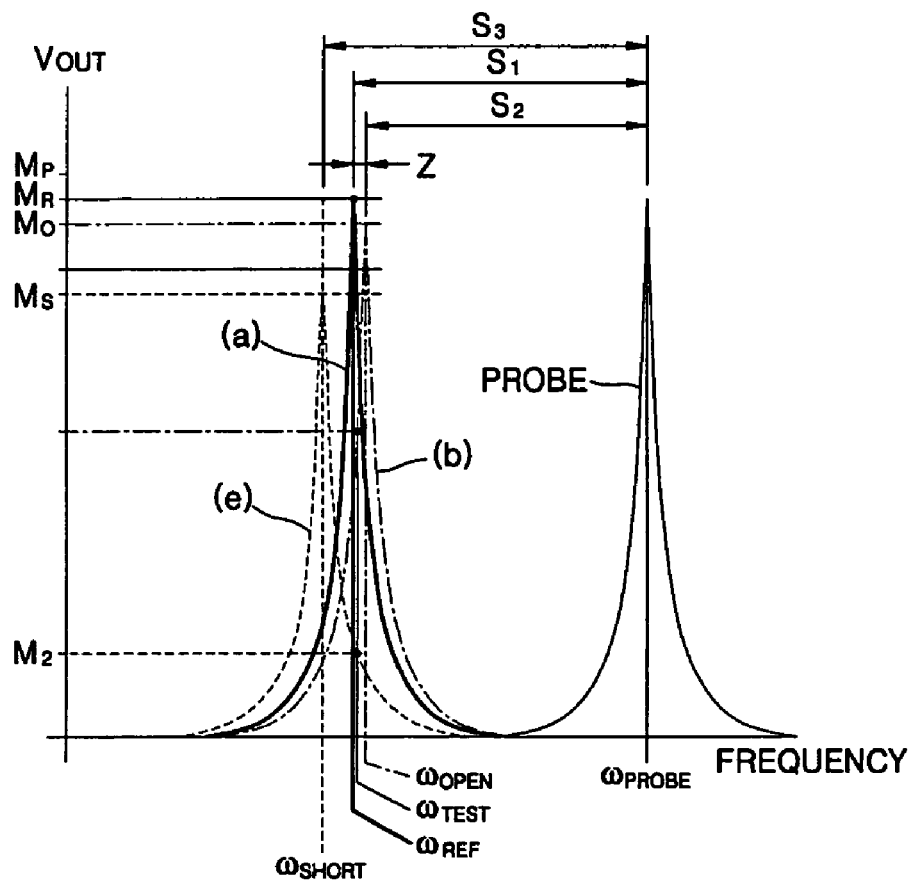
FIG. 4 is a graph showing a frequency response according to the type of a defect of a circuit pattern of FIG. 3.
Figure 5:
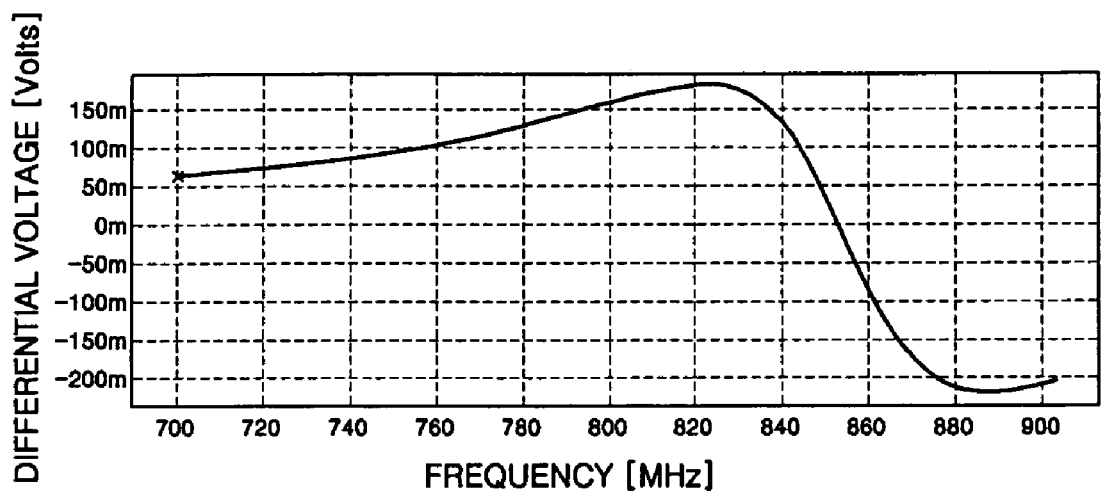
FIG. 5 is a graph showing a differential voltage characteristic of a frequency between a defect-free case and a case in which a 30% mouse bite exists at a near end.
Figure 6:
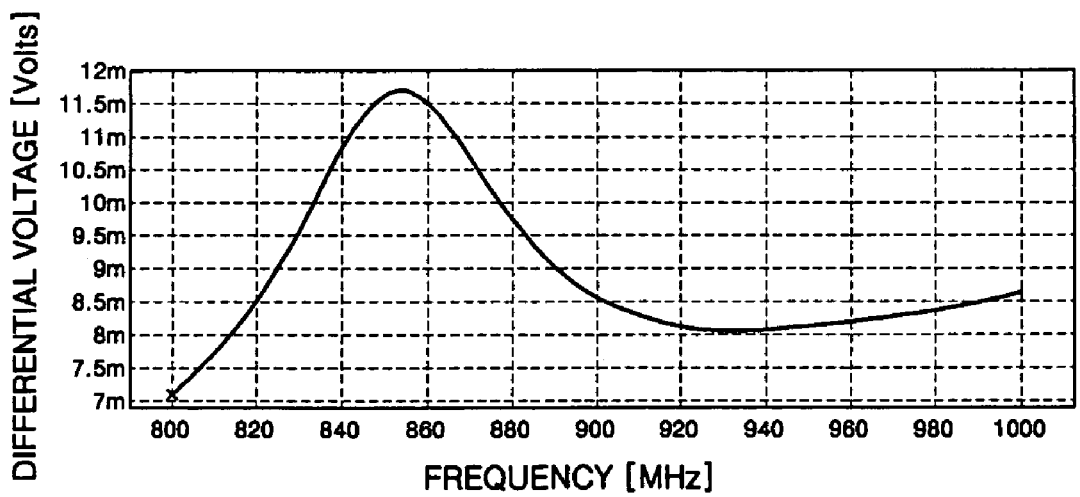
FIG. 6 is a graph showing a differential voltage characteristic of a frequency between a defect-free case and a case in which a 30% mouse bite exists at a far end.

The types of a defect of the circuit pattern 23, as shown in FIG. 3, are an open defect (b), a mouse bite defect (c), a near-short defect (d), and a short defect (e). These defects can be compared with a defect-free case (a) to determine the type thereof. After the frequency and magnitude values of the measurement voltage $V_{OUT}$ in a defect-free case are programmed and input as reference values, the probe 22 contacts the circuit pattern 23 and a measurement voltage is obtained. The values of a frequency and magnitude of the obtained measurement voltage $V_{OUT}$ are compared with the reference values or benchmarks so that the type and position of a defect are detected and the presence of a defect is detected.

The resonator 21 is a resonant circuit made of a resistor R, a capacitor C, and an inductor L which are connected in parallel. The power output from the first power supply unit $V_{in}$ is supplied to the circuit pattern 23. A resonant signal is generated to amplify a signal responded from the circuit pattern 23.

In the circuit pattern defect detecting apparatus 2 according to the present embodiment, the resonator 21 has a high quality factor so as to easily measure a magnitude value of a frequency response responded from the circuit pattern 23 and easily distinguish a difference of the magnitude value of a frequency response between cases in which a defect is present in the circuit pattern 23 and a defect is not present in the circuit pattern 23.

A signal of a particular frequency is amplified by using a resonator formed by a resonant circuit after a signal is received from a radio frequency source. The frequency and magnitude of the measurement voltage $V_{OUT}$ vary according to additional loading generated as a circuit pattern is connected to the resonant circuit.

FIGS. 8 through 10 show the differential voltage in a defect-free case with respect to the respective defects according to the present embodiment. A 10V AC power is applied as the first power supply unit $V_{in}$ and ground is connected as the second power supply unit 25. As shown in FIGS. 8 through 10, the maximum differential voltage detected by the circuit pattern defect detection apparatus 2 having the second power supply unit 25 appears high, regardless of the type of a defect. Also, it can be seen that a difference between the differential voltages according to the position of a defect is much. In contrast, in the circuit pattern defect detection apparatus having no second power supply unit, the maximum differential voltage appears low and the difference between the differential voltages according to the position of a defect is not much. Accordingly, in the case of having the second power supply unit 25, information regarding the presence of a defect can be easily detected. As the characteristic of the differential voltage varies according to the position and type of a defect of the circuit pattern, the position and the type of a defect can be easily recognized.

The detection portion Dp2 includes a measurement portion 26, which is connected between the resonator 21 and the probe 22 and measures a measurement voltage and a determination portion 27 which determines the presence of a defect of a circuit pattern from the measurement voltage. The determination portion 27 detects the presence of a defect of a circuit pattern by comparing the measurement voltage with a voltage measured when there is no defect in the circuit pattern, and determines the type of a defect according to the pattern of the measurement voltage.

When a defect is detected by using the circuit pattern defect detection apparatus according to the present invention, to connected a voltage source or ground to a far end of the probe 21 connected to the circuit pattern 23, a predetermined port is formed at a far end and the circuit pattern 23 is connected to the voltage source or ground. However, this method can produce scratches in the circuit pattern 23. Also, when the far end of the circuit pattern 23 is bonded to the other part thereof, such scratches may directly affect the quality of bonding.

Thus, when the far end of the circuit pattern 23 cannot be directly connected to the second power supply unit 25 such as a voltage source or ground, the voltage source can be connected in a non-contact manner. That is, a magnetic field is formed as the second power supply unit 25 so that electric power can be supplied to the far end of the circuit pattern 23 in a non-contact manner. To this end, a magnetic field is generated around the far end of the circuit pattern by using a radio frequency generation unit so that an effect of connecting the power source by the magnetic field can be obtained.

Figure 15:
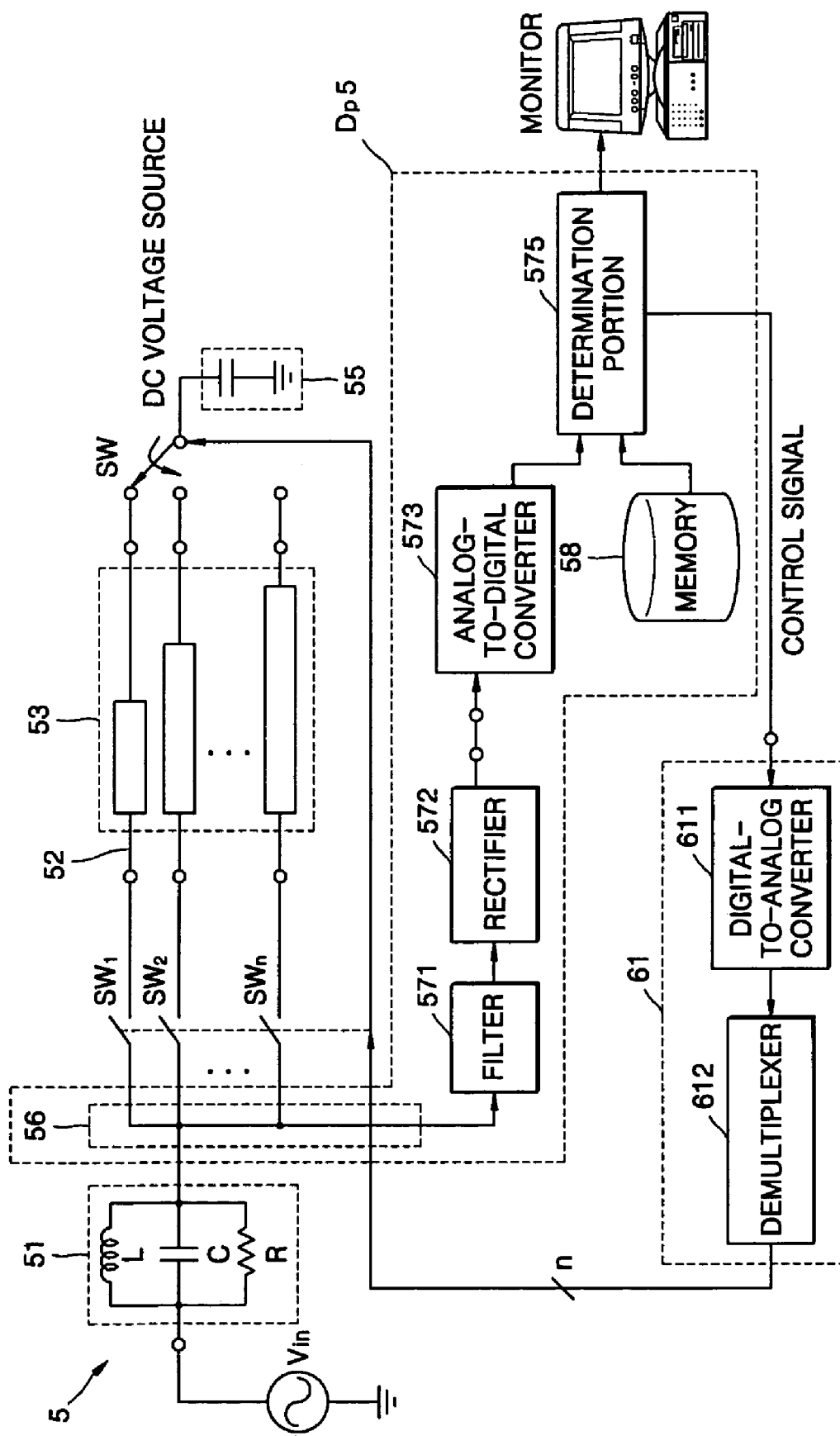
FIG. 15 is a circuit diagram showing an apparatus for detecting a defect of a circuit pattern according to yet further another embodiment of the present invention.

The detection portion Dp2, like a detection portion Dp5 shown in FIG. 15, may include a filter, a rectifier, an analog-to-digital converter, a determination portion, and a memory for storing a lookup table 28. The lookup table 28 may be configured based on values obtained from computer simulation of the position and type of a defect according to the circuit pattern.

Figure 11:
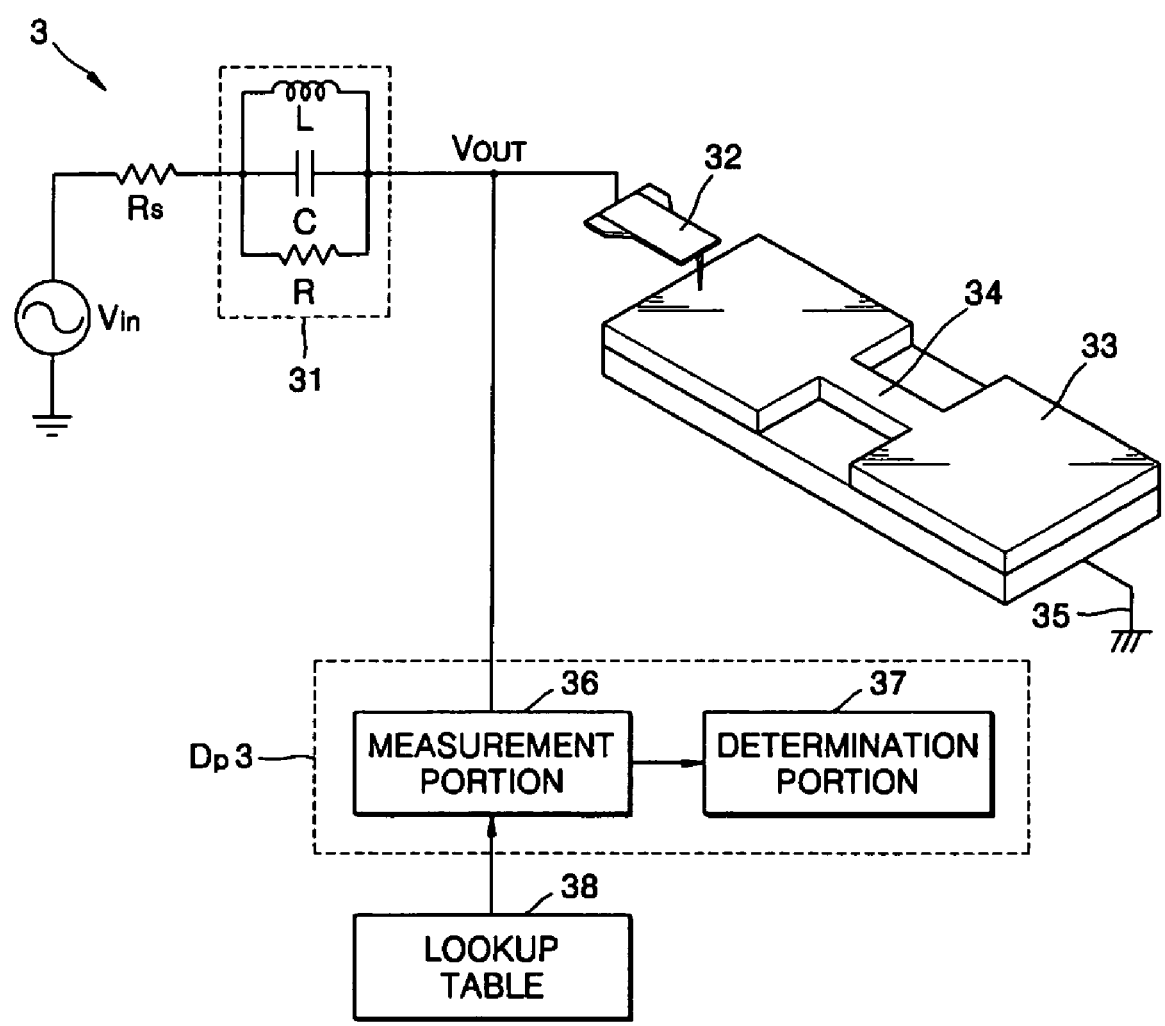
FIG. 11 is a circuit diagram showing an apparatus for detecting a defect of a circuit pattern according to another embodiment of the present invention.
Figure 12:
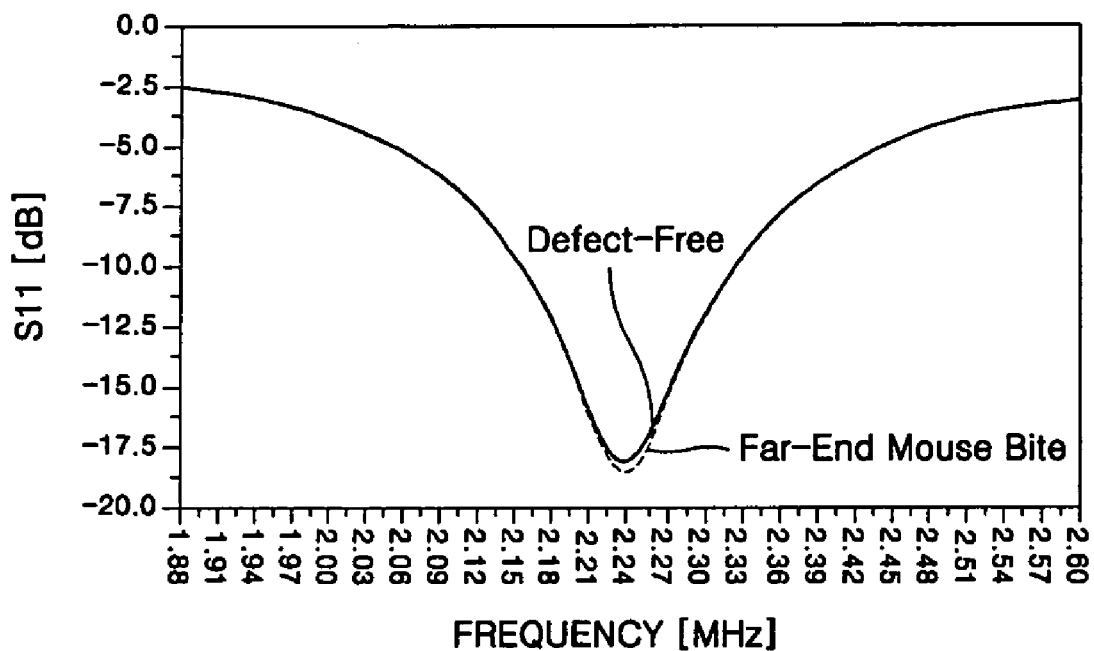
FIG. 12 is a graph showing the result of comparison of a reflection coefficient at an input end between a normal case and a case in which a mouse bite defect detected by the circuit pattern defect detecting apparatus of FIG. 11 exists at a far end when a second power supply unit is not present.
Figure 13:
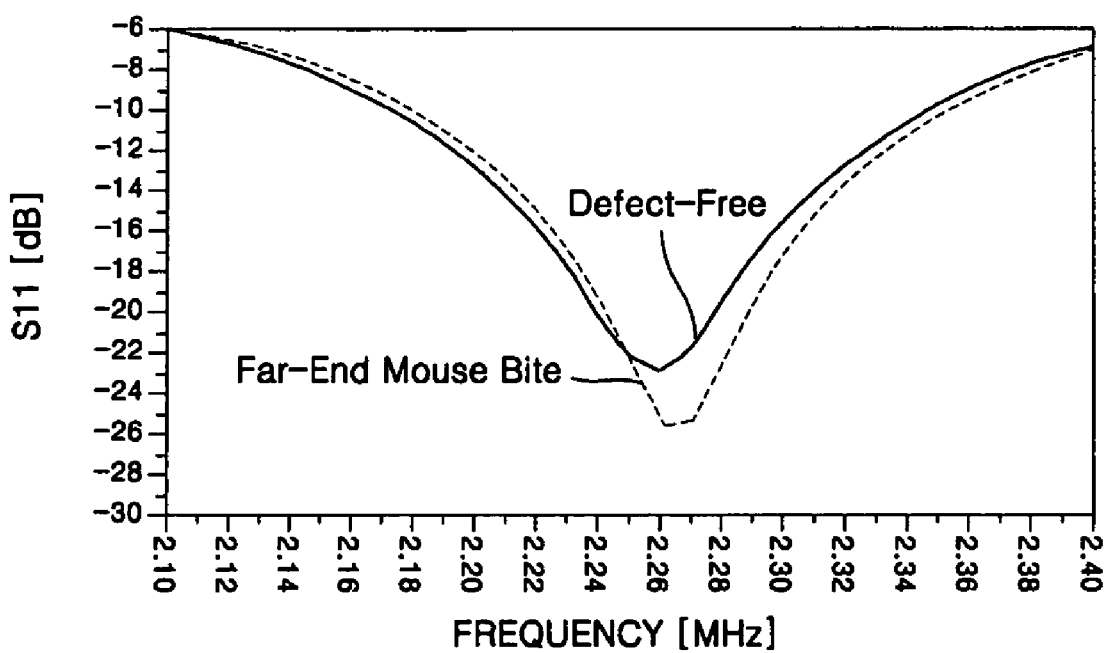
FIG. 13 is a graph showing the result of comparison of a reflection coefficient at an input end between a normal case and a case in which a mouse bite defect detected by the circuit pattern defect detecting apparatus of FIG. 11 exists at a far end when a second power supply unit is present.

FIG. 11 is a circuit diagram showing an apparatus for detecting a defect of a circuit pattern according to another embodiment of the present invention. FIG. 12 is a graph showing the result of comparison of a reflection coefficient at an input end between a normal case and a case in which a mouse bite defect detected by the circuit pattern defect detecting apparatus of FIG. 11 exists at a far end when a second power supply unit is not present. FIG. 13 is a graph showing the result of comparison of a reflection coefficient at an input end between a normal case and a case in which a mouse bite defect detected by the circuit pattern defect detecting apparatus of FIG. 11 exists at a far end when a second power supply unit is present.

Referring to FIGS. 11 through 13, a circuit pattern defect detection apparatus 3 which detects a defect of a circuit pattern of a circuit board, includes a resonator 31, a first power supply unit $V_{in}$, a probe 32, a second power supply unit 35, and a detection portion Dp3. Since the same elements as those of the circuit pattern defect detection apparatus 2 shown in FIG. 7 have the same functions and reference numerals, except for the following points, detailed descriptions thereof will be omitted.

The detection portion Dp3 is connected between the resonator 31 and the probe 32, measures an input end reflection coefficient (S-parameter, S11) that is a ratio of a reflection wave power with respect to an incident wave power of the circuit pattern 33, and detects, the presence and type of a defect of the circuit pattern from the S11. The detection portion Dp3 includes a measurement portion 36 and a determination portion 39.

The measurement portion 36 is connected between the resonator 31 and the probe 32 and measures the S11. The determination portion 37 detects the presence and type of a defect of the circuit pattern 33 from the S11. The determination portion 37 determines the presence and type of a defect of the circuit pattern 33 by comparing the S11 with another S11 that is measured when no defect is present in the circuit pattern 33.

The presence and type of a defect can be detected by measuring the S11 measured when a defect is not present in the circuit pattern 33 and the S11 according to the various types of the defects shown in FIG. 3, creating a lookup table with the measured S11, and comparing the S11 measured by the measurement portion 36 with the S11 in the lookup table.

To this end, the detection portion, as shown in FIG. 15, may include a filter, a rectifier, an analog-to-digital converter, a determination portion, and a memory for storing a lookup table.

Referring to FIGS. 12 and 13, unlike a case (FIG. 12) where the second power supply unit 35 is not provided, when the second power supply unit 35 is provided (FIG. 13), a difference in the resonant frequency and magnitude between a defect-free case and a case in which a mouse bite is present in the far end, is quite distinguished. In the present embodiment, the far end as the second power supply unit is grounded.

Figure 14:
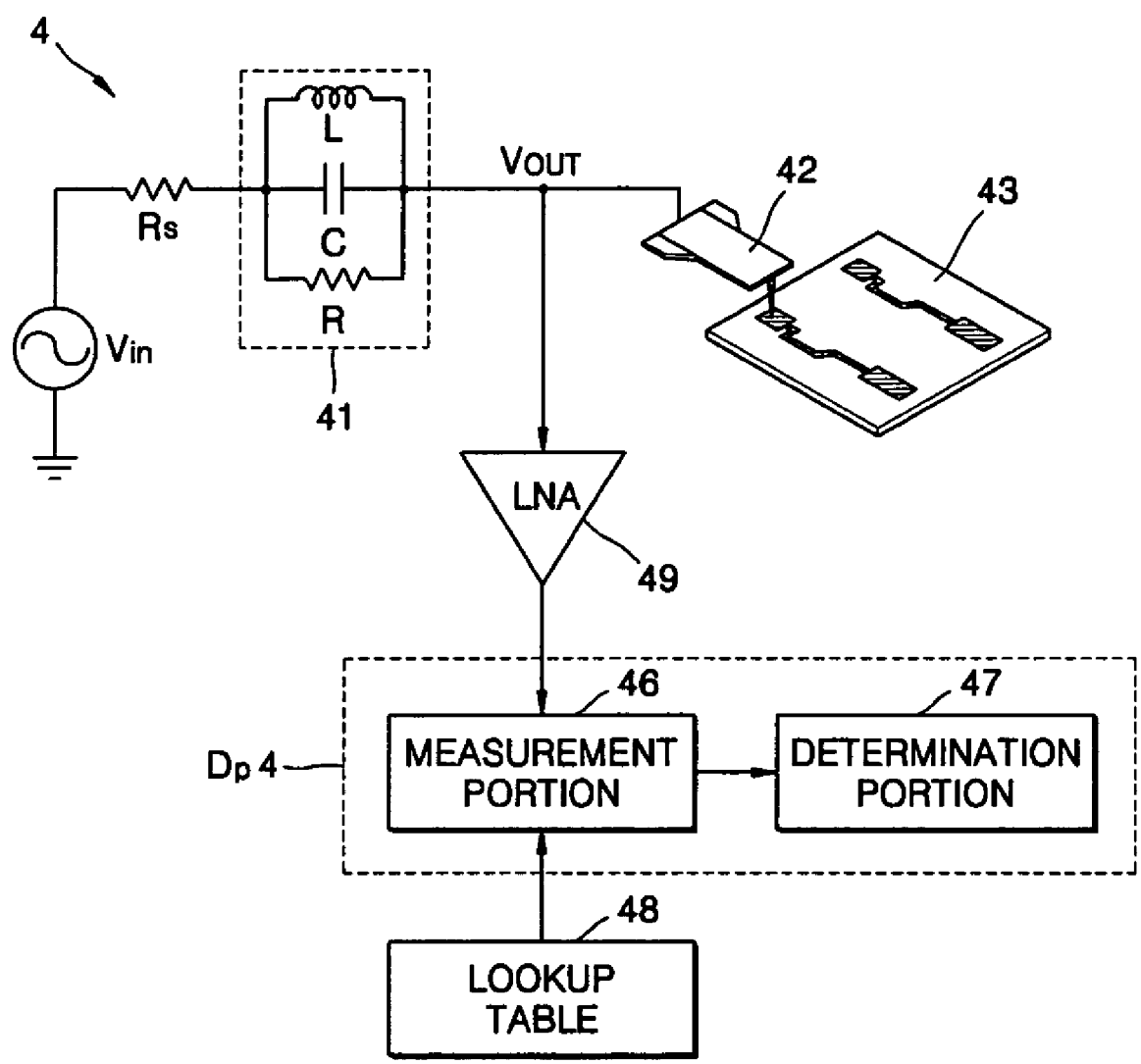
FIG. 14 is a circuit diagram showing an apparatus for detecting a defect of a circuit pattern according to yet another embodiment of the present invention.

FIG. 14 is a circuit diagram showing an apparatus for detecting a defect of a circuit pattern according to yet another embodiment of the present invention. Referring to FIG. 14, an apparatus 4 for detecting a defect of a circuit pattern 43 of a circuit board includes a resonator 41, a first power supply unit $V_{in}$, a probe 42, an amplification portion 49, and a detection portion Dp4. Since the same elements as those of the circuit pattern defect detection apparatuses 2 and 3 shown in FIGS. 7 and 11, respectively, have the same functions and reference numerals, detailed descriptions thereof will be omitted herein.

To clearly distinguish the presence and type of a defect of the circuit pattern 43, a second power supply unit 45 to apply a voltage by being connected to the other end of the circuit pattern 43 may further be provided.

The amplification portion 49 amplifies a modulated signal due to additional loading by the circuit pattern 43 to generate an amplified voltage, and is connected between the resonator 41 and the probe 42. The second power supply unit can be formed by grounding the far end of the circuit pattern.

The amplification portion 49 is a low noise amplifier (LNA) that is used in a high frequency band such as a microwave and can amplify a signal while reducing noise. As the LNA, an Esaki diode amplifier, a parametric amplifier, and a major amplifier may be used.

Since the circuit pattern defect detection apparatus 4 according to the present embodiment amplifies a signal measured between the resonator 41 and the probe 42, the presence and type of a defect can be detected without the second voltage supply unit.

The detection portion is connected to the amplification portion and includes a measurement portion 46 and a determination portion 47. The detection portion measures an amplified voltage to generate a measurement voltage and determines the presence and type of a defect of a circuit pattern from the measurement voltage.

FIG. 15 is a circuit diagram showing an apparatus for detecting a defect of a circuit pattern according to yet further another embodiment of the present invention. Referring to FIG. 15, a system 5 for detecting a defect of a circuit pattern 53 includes a resonator 51, a first power supply unit $V_{in}$, a probe 52, at least one of second switches SW1 . . . SWn, a second power supply unit 55, at least one of second switches SW, the detection portion Dp5, and a switching control portion 61. Here, since the same elements as those of the circuit pattern defect detection apparatuses 2, 3, and 4 shown in FIGS. 7 through 14 have the same functions and are indicated by the same reference numerals, detailed descriptions thereof are omitted herein.

The probe 52 has a plurality of probe portions connected to the other end of the resonator 51 and contacting one end of each circuit pattern 53. The first switches SW1 . . . SWn are connected between the resonator 51 and the probe 52 and switch connections between the resonator 51 and the probe portions of the probe 52. The second switches SW are connected between the other end of each circuit pattern 53 and the second power supply unit 55 and switch connections between each circuit pattern 53 and the second power supply unit 55.

The detection portion Dp5 is connected between the resonator 51 and the respective first switches SW1 . . . SWn. The detection portion measures a voltage generated from the circuit pattern 53 to generate a measurement voltage and detects the presence and type of a defect of the circuit pattern 53 from the measurement voltage. The switching control portion receives a switch control signal from a determination portion 575 and controls switching of the first and second switches SW1 . . . SWn and SW.

The detection portion Dp5 includes a filter 571, a rectifier 572, an analog-to-digital converter 573, a memory 58, and the determination portion 575. Also, the detection portion further includes a measurement portion 56 connected between the resonator 51 and each of the first switches SW1 . . . SWn and measures a voltage generated in the circuit pattern 53.

The filter 571 filters an AC analog signal which is modulated by the circuit pattern 53 and generates a filtering signal. The rectifier 572 receives the filtering signal and generates a DC analog signal. The analog-to-digital converter 573 generates a digital measurement signal from the DC analog signal. The memory 58 stores a reference signal which is a measurement signal data according to the type of a defect of the circuit pattern 53. The determination portion 575 compares the measurement signal and the reference signal and determines the presence and type of a defect of the circuit pattern 53. The reference signal is set by a pattern of a difference between a measurement voltage according to the type of a defect and a signal measured when no defect exists in the circuit pattern 53.

The reference signal stored in the memory 58 can be configured based on a value obtained through a computer simulation of the position and type of a defect according to the circuit pattern 53.

The determination portion 575 generates a digital switching control signal according to the completion of determination of the presence and type of a defect of the circuit pattern 53. The switching control portion includes a digital-to-analog converter 611 to generated an analog switching control signal from the digital switching control signal and a demultiplexer 612 to control switching the first and second switches by the analog switching control signal.

A band pass filter which filters a signal between the first cut-off frequency and a second cut-off frequency based on the first cut-off frequency and the second cut-off frequency higher than the first cut-off frequency is used as the filter 571. Thus, a signal of a too low frequency and a too high frequency is cut off so that the presence and type of a defect can be detected by analyzing a signal in a frequency area of interest.

A LabView data acquisition board can be used as the analog-to-digital converter 573, through which a digital measurement signal can be generated from the DC analog signal. In the memory 58, a reference signal that is a measurement signal data according to the type of a defect of the circuit pattern 53 is stored in form of a lookup table so that the presence and type of a defect can be detected by compared with the measurement signal.

As in the embodiment shown in FIG. 11, the detection portion measures an input end reflection coefficient that is a ratio between a reflection wave power responded from the circuit pattern 53 and an input wave power that is input to the circuit pattern 53 through the probe 52, and compares the measured coefficient with the reference signal so that the presence and type of a defect can be detected. The reference signal is set by a pattern of the input end reflection coefficient according to the type of a defect of the circuit pattern 53.

Generally, since the substrate of an actual semiconductor package is formed of a plurality of circuit patterns, the presence and type of a defect need to be detected for each circuit pattern. To this end, when a resonator is provided for each circuit pattern, not only the size of an equipment increases but also the pitch of the circuit pattern 53 decreases, so that application thereof becomes difficult.

In the circuit pattern defect detection system 5 according to the present embodiment, which is invented to efficiently detect a defect of a plurality of circuit patterns, a single resonator 51 is shared and the resonator 51 and the probe 52 that is connected to one end of each circuit pattern 53 are connected through the first switches SW1 . . . SWn. To this end, TR switches are connected to the respective probes 52 and the first switches SW1 . . . SWn are sequentially connected through the switching control portion 61. Thus, a defect of each circuit pattern 53 can be sequentially detected. The first switches SW1 . . . SWn formed of a single switch can sequentially control the connection between the resonator 51 and the probes 52.

Also, to connect the second power supply unit 55, the second power supply unit 55 and the far end of the circuit pattern 53 are connected through the second switch SW to match the connection between the resonator 51 and the probes 52. Thus, the second power supply unit 55 can be selectively connected to a circuit pattern subject to a defect detection. The second power supply unit 55 can be connected to all of the far ends of the circuit pattern subject to a defect detection.

As described above, according to the apparatus for detecting a defect of a circuit pattern according to the present invention and a defect detection system having the same, the presence of a defect of a fine circuit pattern can be easily detected. Also, a defect of a connection of a circuit pattern can be detected based on a defect standard classified according to the type and position of a defect.

Also, a defect existing at a position separated far from the probe of the circuit pattern can be accurately detected. Further, by lowering a measurement error of a defect of a connection state of a circuit pattern, reliability of a product including the circuit pattern can be improved.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An apparatus to test an electronic device, the apparatus comprising:
   a circuit to apply an electrical parameter to a near end of a circuit pattern where a probe contacts the electronic device;
   a power supply coupled to an opposite end of the circuit pattern separated away from the near end where the probe contacts the electronic device to amplify a differential voltage value of the applied electrical parameter when a defect is present in the electronic device; and
   a detection portion in communication with the circuit to measure an input end reflection coefficient that is a ratio of a reflection wave power with respect to an incident wave power of the electronic device and to compare the measured input end reflection coefficient to an input end reflection coefficient measured when no defect is present in the electronic device to determine a status of the electronic device.

2. The apparatus of claim 1, wherein the electrical parameter is a voltage.

3. The apparatus of claim 1, wherein the electrical parameter is a current.

4. The apparatus of claim 1, wherein the element forms a magnetic field and supplies power to the second section of the electronic device.

5. The apparatus of claim 1, wherein the circuit includes a resonator that comprises a resistor, a capacitor, and an inductor which are connected in parallel.

6. An apparatus to test an electronic device, the apparatus comprising:
   a circuit to apply an electrical parameter to a near end of a circuit pattern where a probe contacts the electronic device;
   an element coupled to an opposite end of the circuit pattern separated away from the near end where the probe contacts the electronic device to amplify a differential voltage value of the applied electrical parameter when a defect is present in the electronic device; and
   a detection portion in communication with the circuit to measure an input end reflection coefficient that is a ratio of a reflection wave power with respect to an incident wave power of the electronic device and to compare the measured input end reflection coefficient to an input end reflection coefficient measured when no defect is present in the electronic device to determine a status of the electronic device.

7. The apparatus of claim 6, wherein the element is a power supply.

8. The apparatus of claim 6, wherein the element is a ground.

9. The apparatus of claim 6, wherein the circuit further comprises a probe and a resonator.

10. The apparatus of claim 9, wherein the detection portion comprises:
    an input end reflection coefficient measurement portion which is connected between the resonator and the probe to measure the input end reflection coefficient; and
    a determination portion which determines presence and type of a defect of the electronic device from the input end reflection coefficient.

11. An apparatus to test an electronic device, the apparatus comprising:
    a circuit to apply an electrical parameter to a near end of a circuit pattern where a probe contacts the electronic device and to sense a value of the applied electrical parameter;
    low noise amplifier coupled to the circuit to amplify
    a differential voltage value of the applied electrical parameter; and
    a detection portion in communication with the amplification portion to measure the amplified value of the applied electrical parameter and to compare the amplified value of the applied electrical parameter to an electrical parameter measured when no defect is present in the electronic device to determine a status of the electronic device;
    wherein said differential voltage value of the applied electrical parameter is representative of a defect status of the electronic device at both the near end of the circuit pattern where the probe contacts the electronic device and a far end of the circuit pattern separated away from the near end where the probe contacts.

12. The apparatus of claim 11, wherein the amplification portion is a low noise amplifier.

13. The apparatus of claim 11, further comprising an element coupled to a second section of the electronic device to change a value of the electrical parameter between the first section of the electronic device and the second section of the electronic device.

14. The apparatus of claim 13, wherein the element is a ground.

15. The apparatus of claim 13, wherein the element is a power supply.

16. The apparatus of claim 13, wherein the electrical parameter is a voltage.

17. The apparatus of claim 13, wherein the electrical parameter is a current.

18. The apparatus of claim 13, wherein the circuit further comprises a probe and a resonator.

19. The apparatus of claim 18, wherein the detection portion comprises:
    a measurement portion connected between the resonator and the probe to measure the value of the applied electrical parameter; and
    a determination portion to determine presence and type of a defect of the electronic device from the value of the applied electrical parameter.

* * * * *